US009428603B2

(12) United States Patent
Kattimuttathu et al.

(10) Patent No.: US 9,428,603 B2
(45) Date of Patent: Aug. 30, 2016

(54) POLYMERIC DISPERSION OF THIOPHENE COPOLYMERS AND A PROCESS FOR PREPARATION THEREOF

(71) Applicant: Council of Scientific & Industrial Research, New Delhi (IN)

(72) Inventors: Ittara Suresh Kattimuttathu, Hyderabad (IN); Mandapati Venkateswara Reddy, Hyderabad (IN)

(73) Assignee: Council of Scientific & Industrial Research (IN)

( * ) Notice: Subject to any disclaimer, the term of this patent is extended or adjusted under 35 U.S.C. 154(b) by 0 days.

(21) Appl. No.: 14/661,581

(22) Filed: Mar. 18, 2015

(65) Prior Publication Data

US 2015/0266987 A1 Sep. 24, 2015

(30) Foreign Application Priority Data

Mar. 18, 2014 (IN) .......................... 0788/DEL/2014

(51) Int. Cl.
*C08G 75/00* (2006.01)
*C08F 228/06* (2006.01)
*H01L 51/00* (2006.01)

(52) U.S. Cl.
CPC ......... *C08F 228/06* (2013.01); *H01L 51/0037* (2013.01); *H01L 51/0043* (2013.01); *H01L 51/0036* (2013.01)

(58) Field of Classification Search
CPC .... C08G 61/126; C08G 75/00; C08F 228/06
See application file for complete search history.

(56) References Cited

U.S. PATENT DOCUMENTS

| 5,300,575 | A | 4/1994 | Jonas et al. |
| 7,008,562 | B2 | 3/2006 | Jonas et al. |
| 7,378,039 | B2 | 5/2008 | Louwet et al. |
| 7,431,866 | B2 | 10/2008 | Hsu et al. |
| 7,999,062 | B2 | 8/2011 | Chen et al. |
| 8,058,387 | B2 | 11/2011 | Chan et al. |
| 2002/0016440 | A1* | 2/2002 | Louwet ................ C08G 61/126 528/373 |
| 2005/0245723 | A1* | 11/2005 | Louwet ................ C08G 61/126 528/373 |

FOREIGN PATENT DOCUMENTS

WO WO-2012/048824 A1 4/2012

OTHER PUBLICATIONS

Lee, Sun Jong, et al.; A Facile Route of Polythiophene Nanoparticles via Fe Catalyzed Oxidative Polymerization in Aqueous Medium; Journal of Polymer Chemistry; (2008); pp. 2097-2107; vol. 46; Wiley Periodicals, Inc.

Asua, J.M., et al. : Reactive Surfactants in Heterophase Polymerization; Acta Polym (1998); pp. 671-686; vol. 49; Wiley-VCH Verlag GmbH; Weinheim; 1998.

(Continued)

*Primary Examiner* — Shane Fang
(74) *Attorney, Agent, or Firm* — Blank Rome LLP

(57) ABSTRACT

The present invention provides a process for preparing copolymers, by oxidatively polymerizing thiophene or substituted thiophene such as 3,4-ethylenedioxythiophene or 3-hexyl thiophene in presence of a reactive surfactant, as aqueous dispersions using catalyst such as $FeCl_3$ and peroxide as the oxidizing agent.

4 Claims, 2 Drawing Sheets

(56) References Cited

OTHER PUBLICATIONS

Evans, Rachel C., et al.; Cationic Polymiophene-Surfactant Self-Assembly Complexes; Phase Trasions. Optical Response, and Sensing; Langmuir. (2012); pp. 12348-12356; vol. 28; American Chemical Society; ACS Publications; 2012.

Kattimuttathu, Suresh I. et al.; Snythesis and Micelization Properties of New Anionic Reactive Surfactants Based on Hydrogenated Cardanol; J. Surface Delerg; (2012); pp. 207-215; vol. 15, Springer AOCS; Nov. 22, 2011.

* cited by examiner

POLYMERIC DISPERSION OF THIOPHENE COPOLYMERS AND A PROCESS FOR PREPARATION THEREOF

CROSS-REFERENCE TO RELATED APPLICATION

This application claims the benefit of co-pending Indian Patent Application No. 0788/DEL/2014, filed Mar. 18, 2014, the disclosure of which is incorporated herein by reference in its entirety.

FIELD OF THE INVENTION

The present invention relates to a process for the preparation of copolymer by oxidatively polymerizing thiophene or substituted thiophene such as 3,4-ethylenedioxythiophene or 3-hexyl thiophene in presence of a reactive surfactant and catalyst such as $FeCl_3$ and peroxide as the oxidizing agent. The present invention also relates to aqueous dispersion of electrically conducting copolymers wherein the electrically conducting polymer is synthesized as aqueous dispersions in presence of a surfactant bearing polymerizable groups.

BACKGROUND OF THE INVENTION

Electrically conducting polymers have been widely researched as material of choice for a variety of organic electronic applications like polymer light emitting diodes, solid state lighting, organic photovoltaic's, field effect transistors, ultra capacitors and electroluminescent devices. Conjugated polythiophene and substituted thiophene derivatives show electrically conducting properties. One advantageous feature of polythiophene copolymers is that they can be casted into films and doped and their electrical properties modified accordingly.

There is demand for improved conducting polythiophene with good processability, preferable as aqueous dispersions and increased conductivity as it facilitates developing environment friendly processes for conducting polymers and facilitates fabrication of large area structures. Surfactants are used to produce stable dispersions with better film formation characteristics and mechanical properties. Conventional surfactants like sodium lauryl sulphate (SLS) adversely influence the final product properties because of surfactant migration and aggregation resulting from its dynamic nature. To overcome these disadvantages, reactive surfactants were developed. Reactive surfactants are low molecular weight and are known to undergo copolymerization with the main monomer. Reactive surfactants (surfmers) impart better stability to the colloidal particles and improve coating properties like adhesion and water sensitivity of the dried films (1,2). Reactive surfactants limit the surfactant mobility through chemical attachment to the polymer backbone, and therefore desorption of the surfactant from the latex particle or its migration to the film surface can be prevented. The main advantages are better stabilized emulsions, better adhesion to the substrate, since there is no surfactant migration and improved film properties. [1] Asua J M, Schoonbrood H A S (1998) Reactive surfactants in heterophase polymerization. Acta Polym 49:671-686. [2] Mestach D (2004) Reactive surfactants for commercial polymer dispersions. (Prog Colloid Polym Sci 124: 37-41).

Prior art descriptions describe several approaches to make processable polythiophene copolymers.

Reference may be made to U.S. Pat. No. 7,999,062 B2, 2011 and U.S. Pat. No. 8,058,387 B2, 2011 wherein described are soluble polythiophene derivatives containing highly coplanar repeat units with improved degree of intra molecular conjugation and intermolecular pi-pi interactions. The presence of long alkyl side chain is known to enhance the solubility. These are organic solvent based processes and may not be environment friendly.

U.S. Pat. No. 7,431,866 B2 described aqueous dispersions of polythiophene and colloid forming polymeric acids. Specifically, the polymerization of ethylene dioxythiophene in presence of NAFION was carried out. The colloid forming polymeric acids are not water soluble and organic solvents are also used alongside, which makes them non-environment friendly, and are also based on fluorosulphonic acids to improve aqueous processability and doping.

Similarly, U.S. Pat. No. 8,039,833, (2011) B1 describes methods to produce side chain substituted polythiophene, soluble, at least 0.1 percent by weight solubility in common organic solvents like THF, toluene, etc. Here again the organic solvent based processes are used to make films.

Reference may also be made to U.S. Pat. No. 7,378,039, where a process for aqueous or non aqueous solution or dispersion of polythiophene or thiophene copolymer is disclosed. The polymer polystyrene sulphonic acid is used. Hence limitations of water solubility may arise and there is no plasticizing alkyl group to improve the processability. The system also uses water miscible organic solvents. A method of forming polythiophene dispersions is disclosed by Jonas et al. in U.S. Pat. No. 7,008,562, assigned to Bayer Aktiengesselschaft uses organic solvents to facilitate dispersion and wetting of the samples.

Similarly, U.S. Pat. No. 5,300,575 (1994) discloses polythiophene dispersions, their production and their use (by Jonas et al., Bayer Aktiengesselschaft), where the object of the invention was to produce antistatic coatings from an aqueous medium, which in turn are expected to have long shelf life and good processing properties. The polythiophene also polymerize at high polymerization rates in presence of polyacids. The anions of polymeric acids (carboxylic or sulphonic type) are used to facilitate dispersion. Reference may also be made to WO20120488224, PCT/EP2011/005021, where a process for producing ethylene dioxy thiophene with defined sulphate content is disclosed.

None of these prior art descriptions disclose use of reactive surfactant to make stable aqueous dispersions.

The drawback of the prior art product is that the polymer do not posses any hydrophilic groups and so not water dispersible. The water based processes for conjugated polymers are environment friendly. The prior art products also do not show any tunable emission properties like broad range emission characteristics that vary with the concentration of the co-monomer, the reactive surfactant.

OBJECTIVES OF THE INVENTION

The objective of the present invention is to provide a copolymer obtained by oxidatively polymerizing thiophene or substituted thiophene in presence of a reactive surfactant.

Another object of the present invention is to provide a process for the preparation of copolymer by oxidatively polymerizing thiophene or substituted thiophene such as 3,4-ethylenedioxythiophene or 3-hexyl thiophene in presence of a reactive surfactant and catalyst such as $FeCl_3$ and peroxide as the oxidizing agent.

Still another object of the present invention is to provide a process for producing aqueous dispersion of poly(3,4-ethylenedioxy thiophene) and a copolymer of thiophene and 3-hexylthiophene along with reactive surfactant.

Yet another object of the present invention is to provide a process for making poly ethylenedioxy thiophene like poly (3,4-ethylene dioxythiophene) and the polymerizable surfactant is acryloxy pentadecyl phenyl sulfonate.

SUMMARY OF THE INVENTION

Accordingly the present invention provides a compound of formula I

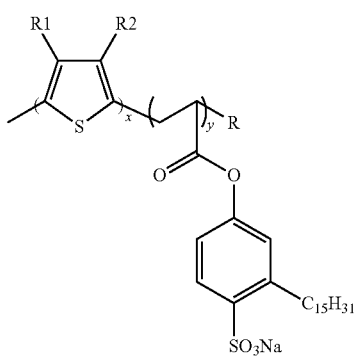

(I)

wherein, R=H or

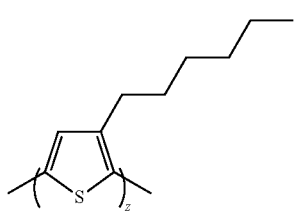

and $R_1$, $R_2$=H or

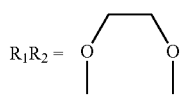

Compound 1, x=99.55 mol %, y=0.45 mol %, z=0,
Compound 2, x=99.78 mol %, y=0.22 mol %, z=0,
Compound 3, x=99.91 mol %, y=0.09 mol %, z=0,
Compound 4, x=99.955 mol %, y=0.045 mol %, z=0,
Compound 5, x=99.55 mol %, y=0.45 mol %, z=0,
Compound 6, x=99.55 mol %, y=0.45 mol %, z=0,
Compound 7, x=99.555 mol %, y=0.045 mol %, z=0,
Compound 8, x=93.37 mol %, y=6.63 mol %, z=0,
Compound 9, x=66.6 mol %, y=32.8 mol %, z=0.6 mol %.

In an embodiment of the present invention, the present invention provides representative compounds selected from the group consisting of:

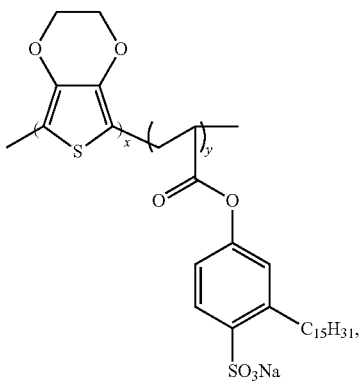

x = 99.5 mol %
y = 0.05-0.45 mol %

Compound 1, x=99.55 mol %, y=0.45 mol %, z=0,
Compound 2, x=99.78 mol %, y=0.22 mol %, z=0,
Compound 3, x=99.91 mol %, y=0.09 mol %, z=0,
Compound 4, x=99.955 mol %, y=0.045 mol %, z=0,
Compound 5, x=99.55 mol %, y=0.45 mol %, z=0,
Compound 6, x=99.55 mol %, y=0.45 mol %, z=0,
Compound 7, x=99.555 mol %, y=0.045 mol %, z=0;

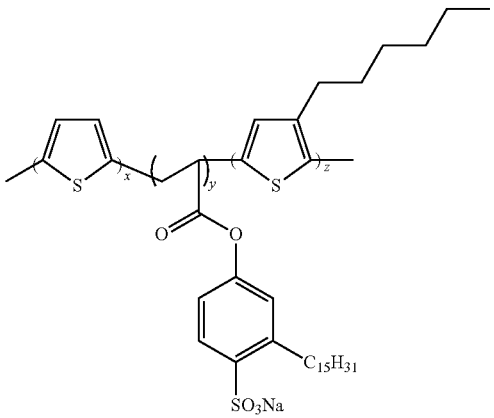

x = 93 mol %
y = 7 mol %

Compound 8, x=93.37 mol %, y=6.63 mol %, z=0; and

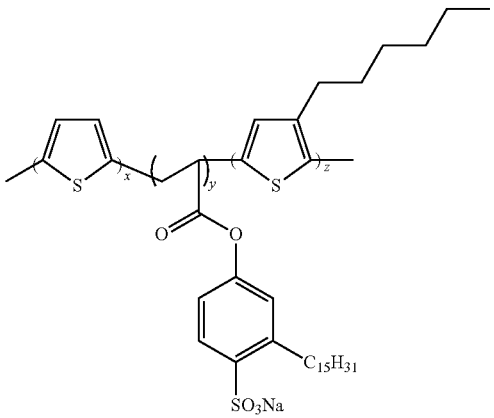

x = 66.6 mol %
y = 0.6 mol %
z = 32.8 mmol %

Compound 9, x=66.6 mol %, y=32.8 mol %, z=0.6 mol %.

The present invention also provides a process for the preparation of copolymer by oxidatively polymerizing thiophene or substituted thiophene in presence of a reactive surfactant, wherein the process steps comprises:

(a) dissolving the reactive surfactant in deionized water with stirring to make a homogenous aqueous mixture;

(b) bubbling $N_2$ in the homogeneous aqueous mixture obtained in step (a) for a period ranging between 5 minutes-30 minutes followed by addition of a monomer and mixture of monomer thereof to obtain a mixture;

(c) initiating the reaction for polymerization in the mixture obtained in step (b) by adding $FeCl_3$ and $H_2O_2$ with stirring for a period in the range of 12-24 hrs to obtain the dispersion; and (d) filtering the dispersion obtained in step (c) and then freeze drying the compound to obtain powder form or optionally caste into films.

In an embodiment of the present invention, the present invention provides a reactive surfactant sulfonated-3-pentadecyl phenyl acrylate.

In another embodiment of the present invention, the present invention provides the monomer selected from the group consisting of thiophene, 3,4-ethylenedioxythiophene, and 3-hexylthiophene.

In still another embodiment of the present invention, the present invention provides the yield of the compound is in the range of (54-76) %.

DETAILED DESCRIPTION OF THE INVENTION

Figure 1:
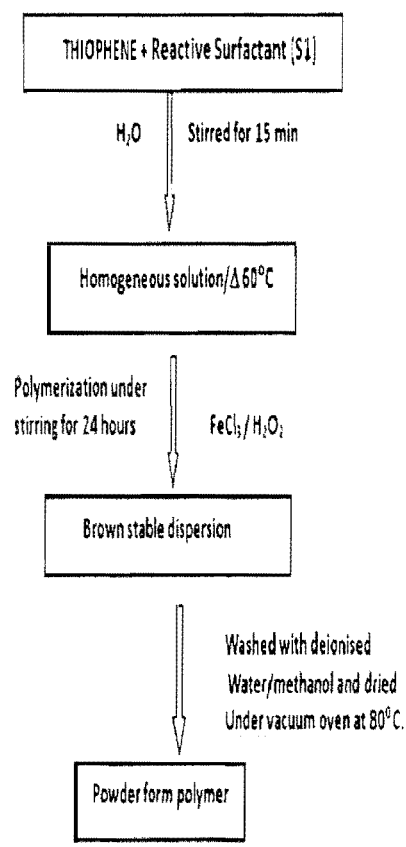
FIG. 1: Flow chart of the process for preparation of polymer dispersion and polymer thereof.

The details of the surfactant synthesis and the properties have been disclosed in detail in earlier publication (K. I. Suresh et al. Journal of surfactants & Detergents, 15, 207-215, 2012). The polymerization is carried out in water and the resulting reaction mixture can be lyophilized to get the product in powder form.

In the process according to the present invention thiophene monomers are oxidatively polymerized in the presence of the sulphonated acrylic monomer, preferably in the presence of sulphonated pentadecyl phenyl acrylate. These compounds are able to act as surfactants on the one hand and improve the processability of the polymer formed. The sulphonate groups present can also helps in the doping of the conducting polymers. These compounds can also be prepared conveniently from the renewable resource cardanol, obtained as a byproduct of the cashew processing industry. Thus, dispersions of conducting polymers without any free surfactant can be prepared. The reactive surfactant due to its structural features can modify the chain packing and hence the band gap of the conducting polymer.

The oxidative agents that are suitable for the oxidative polymerization of thiophene can be used. For practical reasons, inexpensive and easy to handle oxidizing agents are preferred, for example iron (III) salts such as $FeCl_3$, $Fe(ClO_4)_3$ and the iron (III) salts of organic acids. Inorganic peroxide for example t-butyl peroxide, diisobutyryl peroxide, didecanoyl peroxide, dibenzoyl peroxide, t-butyl peroxy benzoate, di-tert-amyl peroxide can also be used as oxidizing agents.

The concentration of thiophene monomers and of sulphonated acrylate monomer in the aqueous medium is preferably chosen such that after oxidative polymerization of the thiophene monomer in presence of the sulphonated monomer, a dispersion is obtained which comprise the complexes of polythiophene and sulphonated acrylate monomer in a range from 0.1 to 30 wt %, preferably in a range from 0.5 to 20 wt % and still more preferably in a range from 1 to 10 wt %.

Reactive surfactants are useful in the preparation of stable aqueous polymer dispersions but effect of properties of conducting polymers has not been studied.

According to a particularly preferred embodiment of the composition it is furthermore preferable to have a water content determined by gravimetric method.

Accordingly the present invention provides a process for the preparation of polythiophene and its copolymer dispersions employing reactive surfactant which comprises the steps of:

(a) providing a homogeneous aqueous mixture of water and thiophene;

(b) providing an aqueous dispersion of the polymerizable acid co-monomer in its salt form (sulphonate);

(c) combining the thiophene mixture with the aqueous dispersion of the polymerizable sulphonate co-monomer; and (d) combining the thiophene mixture with the aqueous dispersion of the polymerizable acid co-monomer salt and combining the oxidiser and a catalyst in any order, with said aqueous dispersions of the polymerizable acid co-monomer before or after the combing steps of c.

Scheme 1 Below Provides the Structure of the Copolymers Prepared in the Present Invention.

Examples: 1-4

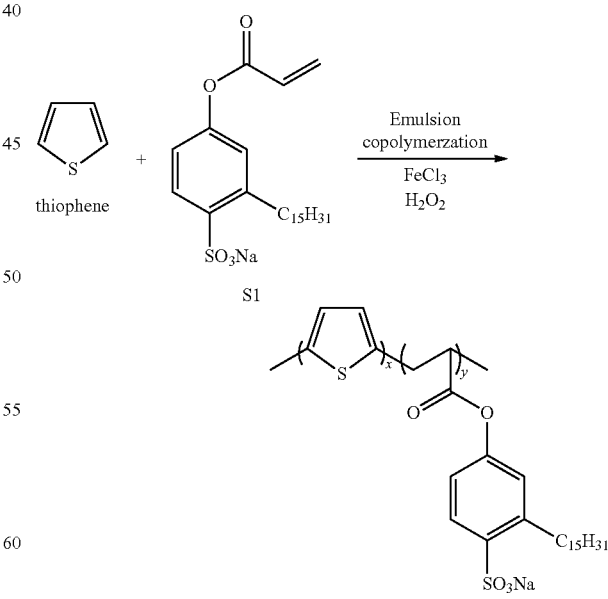

x = 99.5 mol %
y = 0.05-0.45 mol %

Note: Examples 5, 6, 7 is for varied amount of FeCl3 and H2O2.

Example: 8

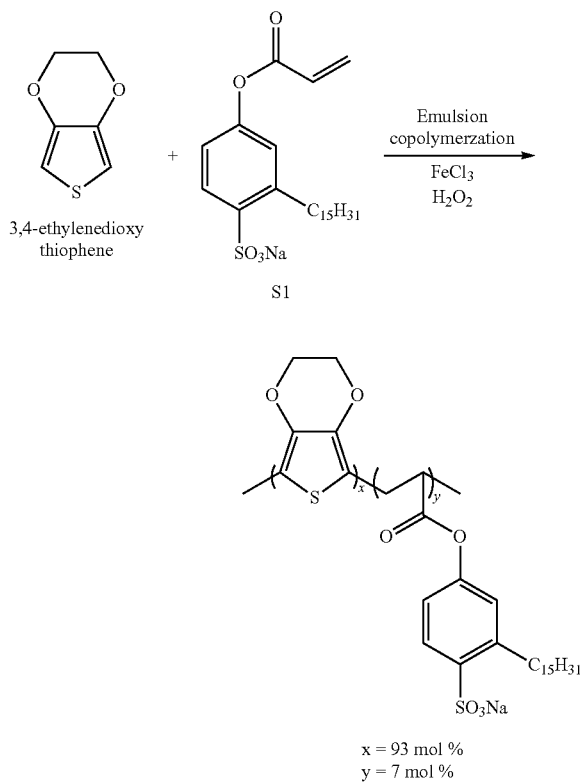

Example: 9

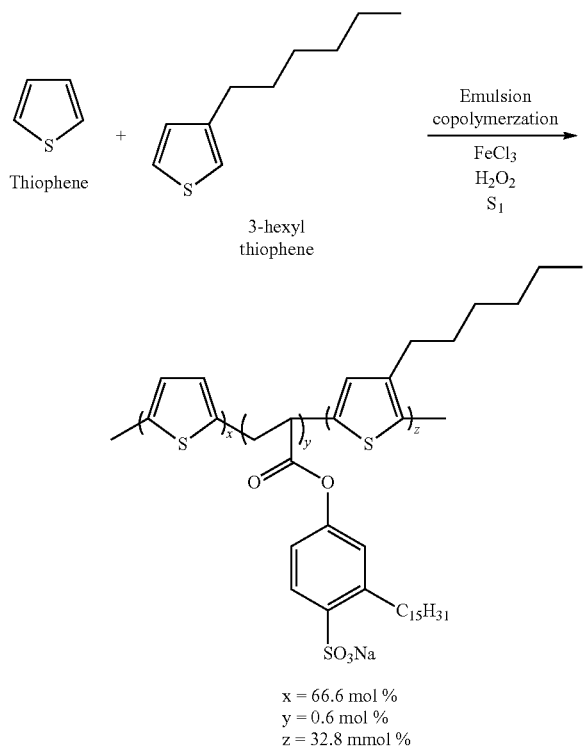

EXAMPLES

The following examples are given by way of illustration of the working of the invention in actual practice and should not be construed to limit the scope of the present invention in any way.

Example-1

Figure 2:
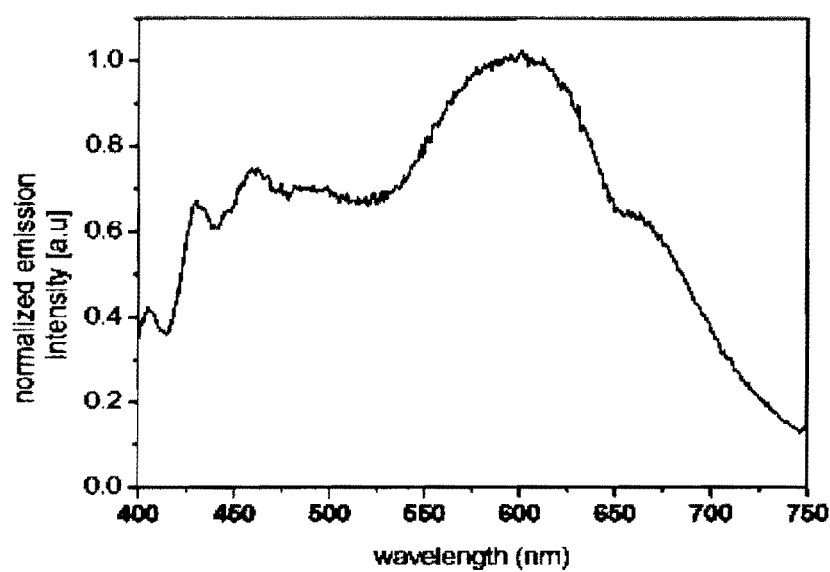
FIG. 2: Broad emission characteristic of the polythiophene prepared with reactive surfactant.

At 60° C., 50 mg of the reactive surfactant sulphonated-3-pentadecyl phenyl acrylate (S1) of Scheme 1 was dissolved in 60 gm of deionized water in a 500 mL round bottomed flask fitted with a mechanical stirrer and nitrogen inlet. After bubbling $N_2$ through the mixture, for 30 min, 2 g of thiophene monomer was added. $FeCl_3$ (7 mg) and $H_2O_2$ (6 g, 30%) was then added to initiate the polymerization reaction. The reaction mixture was stirred for 24 hours. The dispersion so obtained was filtered through 250 micron nylon filter and the product obtained was characterized for particle size to obtain a 2.4 wt % dispersion of modified polythiophene which can be freeze dried to obtain the polymer in powder form or casted into films. The final product is Poly(thiophene-co-sulphonated pentadecyl phenyl acrylate). Yield 71%. Typical emission spectra of the sample recorded in THF is shown as FIG. 2.

Example-2

At 60° C., 25 mg of the reactive surfactant sulphonated-3-pentadecyl phenyl acrylate (S1) was dissolved in 60 gm of deionized water in a 500 mL round bottomed flask fitted with a mechanical stirrer and nitrogen inlet. After bubbling $N_2$ through the mixture, for 30 min, 2 g of thiophene monomer was added. $FeCl_3$ (7 mg) and $H_2O_2$ (6 g, 30%) was then added to initiate the polymerization reaction. The reaction mixture was stirred for 24 hours. The dispersion so obtained was filtered through 250 micron nylon filter and the product obtained was characterized for particle size to obtain a 2.1 wt % dispersion of modified polythiophene which can be freeze dried to obtain the polymer in powder form or casted into films. Poly(thiophene-co-sulphonated pentadecyl phenyl acrylate). See Scheme 1 for composition, Yield 62%.

Example-3

At 60° C., 10 mg of the reactive surfactant sulphonated-3-pentadecyl phenyl acrylate (S1) was dissolved in 60 gm of deionized water in a 500 mL round bottomed flask fitted with a mechanical stirrer and nitrogen inlet. After bubbling $N_2$ through the mixture, for 30 min, 2 g of thiophene monomer was added. $FeCl_3$ (7 mg) and $H_2O_2$ (6 g, 30%) was then added to initiate the polymerization reaction. The reaction mixture was stirred for 24 hours. The dispersion so obtained was filtered through 250 micron nylon filter and the product obtained was characterized for particle size to obtain a 2.0 wt % dispersion of modified polythiophene which can be freeze dried to obtain the polymer in powder form or casted into films. Final product is the copolymer of reactive surfactant with thiophene as in scheme 1. Yield 58%.

Example-4

At 60° C., 5 mg of the reactive surfactant sulphonated-3-pentadecyl phenyl acrylate (S1) was dissolved in 60 gm of deionized water in a 500 mL round bottomed flask fitted with a mechanical stirrer and nitrogen inlet. After bubbling $N_2$ through the mixture, for 30 min, 2 g of thiophene monomer was added. FeCl$_3$ (7 mg) and H$_2$O$_2$ (6 g, 30%) was then added to initiate the polymerization reaction. The reaction mixture was stirred for 24 hours. The dispersion so obtained was filtered through 250 micron nylon filter and the product obtained was characterized for particle size to obtain a 2.4 wt % dispersion of modified polythiophene which can be freeze dried to obtain the polymer in powder form or casted into films. Final product is the copolymer of reactive surfactant with thiophene as in scheme 1. Yield 54%.

Example-5

At 60° C., 50 mg of the reactive surfactant sulphonated-3-pentadecyl phenyl acrylate (S1) was dissolved in 60 gm of deionized water in a 500 mL round bottomed flask fitted with a mechanical stirrer and nitrogen inlet. After bubbling N$_2$ through the mixture, for 30 min, 2 g of thiophene monomer was added. FeCl$_3$ (7 mg) and H$_2$O$_2$ (12 g, 30%) was then added to initiate the polymerization reaction. The reaction mixture was stirred for 24 hours. The dispersion so obtained was filtered through 250 micron nylon filter and the product obtained was characterized for particle size to obtain a 1.8 wt % dispersion of modified polythiophene which can be freeze dried to obtain the polymer in powder form or casted into films. Final product is the copolymer of reactive surfactant with thiophene as in scheme 1. Yield 55%.

Example-6

At 60° C., 50 mg of the reactive surfactant sulphonated-3-pentadecyl phenyl acrylate (S1) was dissolved in 60 gm of deionized water in a 500 mL round bottomed flask fitted with a mechanical stirrer and nitrogen inlet. After bubbling N$_2$ through the mixture, for 30 min, 2 g of thiophene monomer was added. FeCl$_3$ (14 mg) and H$_2$O$_2$ (6 g, 30%) was then added to initiate the polymerization reaction. The reaction mixture was stirred for 24 hours. The dispersion so obtained was filtered through 250 micron nylon filter and the product obtained was characterized for particle size to obtain a 2.6 wt % dispersion of modified polythiophene which can be freeze dried to obtain the polymer in powder form or casted into films. Final product is the copolymer of reactive surfactant with thiophene as in scheme 1. Yield 76%.

Example-7

At 60° C., 50 mg of the reactive surfactant sulphonated-3-pentadecyl phenyl acrylate (SI) was dissolved in 60 gm of deionized water in a 500 mL round bottomed flask fitted with a mechanical stirrer and nitrogen inlet. After bubbling N$_2$ through the mixture, for 30 min, 2 g of thiophene monomer was added. FeCl$_3$ (7 mg) and H$_2$O$_2$ (3 g, 30%) was then added to initiate the polymerization reaction. The reaction mixture was stirred for 24 hours. The dispersion so obtained was filtered through 250 micron nylon filter and the product obtained was characterized for particle size to obtain a 2.3 wt % dispersion of modified polythiophene which can be freeze dried to obtain the polymer in powder form or casted into films. Final product is the copolymer of reactive surfactant with thiophene as in scheme 1. Yield 67%.

Example-8

At 60° C., 300 mg of the reactive surfactant sulphonated-3-pentadecyl phenyl acrylate (S1) was dissolved in 60 gm of deionized water in a 500 mL round bottomed flask fitted with a mechanical stirrer and nitrogen inlet. After bubbling N$_2$ through the mixture, for 30 min, 1.3 g of 3,4-ethylenedioxy thiophene monomer was added. FeCl$_3$ (7 mg) and H$_2$O$_2$ (6 g, 30%) was then added to initiate the polymerization reaction. The reaction mixture was stirred for 24 hours. The dispersion so obtained was filtered through 250 micron nylon filter and the product obtained was characterized for particle size to obtain a 1.4 wt % dispersion of modified polythiophene which can be freeze dried to obtain the polymer in powder form or casted into films. Final product is the copolymer of reactive surfactant with thiophene as in scheme 1. Yield 67%.

Example-9

At 60° C., 50 mg of the reactive surfactant sulphonated-3-pentadecyl phenyl acrylate (S1) was dissolved in 60 gm of deionized water in a 500 mL round bottomed flask fitted with a mechanical stirrer and nitrogen inlet. After bubbling N$_2$ through the mixture, for 30 min, 1 g of thiophene and 1 g 3-hexyl thiophene monomer was added. FeCl$_3$ (7 mg) and H$_2$O$_2$ (3 g, 30%) was then added to initiate the polymerization reaction. The reaction mixture was stirred for 24 hours. The dispersion so obtained was filtered through 250 micron nylon filter and the product obtained was characterized for particle size to obtain a 1.2 wt % dispersion of modified polythiophene which can be freeze dried to obtain the polymer in powder form or casted into films. Final product is the copolymer of reactive surfactant with thiophene as in scheme 1. Yield 38%.

ADVANTAGES OF THE INVENTION

The main advantages of the present invention are:
1. The copolymer of poly thiophene and reactive surfactant is largely amorphous and is soluble in common organic solvents.
2. Exhibit broad emission characteristics in the visible region of the electromagnetic spectrum.
3. There are no low molecular weight ingredients which may affect the device performance adversely.

We claim:

1. A process for preparing a copolymer of at least one type of repeating units of thiophene or substituted thiophene in the presence of a reactive surfactant, wherein the process steps comprise:
    (a) dissolving the reactive surfactant in deionized water with stirring to make a homogeneous aqueous mixture;
    (b) bubbling N$_2$ in the homogeneous aqueous mixture obtained in step (a) for a period ranging between 5 minutes to 30 minutes followed addition of a thiophene or substituted thiophene monomer, or a mixture thereof to obtain a mixture;
    (c) initiating polymerization in the mixture obtained in step (b) by adding FeCl$_3$ and H$_2$O$_2$ with stirring for a period in the range of 12 hrs to 24 hrs to obtain a dispersion; and
    (d) filtering the dispersion obtained in step (c) and then freeze drying the copolymer to obtain a powder form or optionally in cast film form, wherein the reactive surfactant is incorporated in the backbone of the copolymer with the thiophene or substituted thiophone.

2. The process as claimed in claim 1, wherein the thiophene or substituted thiophene is selected from the group consisting of thiophene, 3,4-ethylenedioxythiophene, and 3-hexylthiophene.

3. The process as claimed in claim 1, wherein the yield of the copolymer is in the range of (54-76)%.

4. The process as claimed in claim 1, wherein the reactive surfactant is sulfonated-3-pentadecyl phenyl acrylate.

* * * * *